United States Patent [19]
Lee

[11] Patent Number: 5,441,684
[45] Date of Patent: Aug. 15, 1995

[54] METHOD OF FORMING MOLDED PLASTIC PACKAGES WITH INTEGRATED HEAT SINKS

[75] Inventor: Sang S. Lee, Sunnyvale, Calif.

[73] Assignee: VLSI Technology, Inc., San Jose, Calif.

[21] Appl. No.: 126,346

[22] Filed: Sep. 24, 1993

[51] Int. Cl.⁶ .................... B29C 45/14; B29C 33/56
[52] U.S. Cl. .................... 264/135; 264/272.13; 264/272.17; 264/276
[58] Field of Search ........... 264/129, 134, 135, 272.11, 264/272.13, 272.15, 272.17, 276

[56] References Cited

U.S. PATENT DOCUMENTS

| | | | |
|---|---|---|---|
| 3,381,071 | 4/1968 | Logan et al. | 264/135 |
| 3,715,423 | 2/1973 | Dunn | 264/276 |
| 3,754,070 | 8/1973 | Dunn et al. | 264/272.17 |
| 3,930,114 | 12/1975 | Hodge | 264/272.17 |
| 4,507,675 | 3/1985 | Fujii et al. | 357/70 |
| 4,514,752 | 4/1985 | Engel et al. | 264/272.17 |
| 4,611,389 | 9/1986 | Blair et al. | 29/589 |
| 4,637,130 | 1/1987 | Fujii et al. | 29/588 |
| 4,816,426 | 3/1989 | Bridges et al. | 437/207 |
| 4,823,234 | 4/1989 | Konishi et al. | 361/386 |
| 4,868,349 | 9/1989 | Chia | 174/52.4 |
| 4,888,307 | 12/1989 | Spairisano et al. | 437/216 |
| 5,032,543 | 7/1991 | Black et al. | 264/272.17 |
| 5,041,902 | 8/1991 | McShane | 357/79 |
| 5,065,281 | 11/1991 | Hernandez et al. | 361/388 |
| 5,139,973 | 8/1992 | Nagy et al. | 437/211 |
| 5,144,412 | 9/1992 | Chang et al. | 357/74 |
| 5,147,827 | 9/1992 | McShane et al. | 264/272.17 |
| 5,152,057 | 10/1992 | Murphy | 29/883 |
| 5,155,579 | 10/1992 | Auyeung | 357/81 |
| 5,218,759 | 7/1993 | Juskey et al. | 264/272.17 |
| 5,306,459 | 4/1994 | Thomason | 264/276 |

FOREIGN PATENT DOCUMENTS

| | | | |
|---|---|---|---|
| 2900114 | 2/1980 | Germany | 264/272.17 |
| 54-152971 | 12/1979 | Japan | 264/272.17 |
| 58-7322 | 1/1983 | Japan | 264/272.17 |
| 3-60048 | 3/1991 | Japan | 264/272.17 |
| 4-184944 | 7/1992 | Japan | 264/272.17 |

OTHER PUBLICATIONS

Article entitled: "Vinex Thermoplastic Polyvinyl Alcohol Copolymer Resins"–2000 Series, *Air Products and Chemicals, Inc.,* (1991).
Article entitled: "LEAD/lock 1000 and 1100 Tapes for Semiconductor Packaging Applications", *R/flex Circuit Materials (Rogers),* no date.

*Primary Examiner*—Jay H. Woo
*Assistant Examiner*—Duane S. Smith
*Attorney, Agent, or Firm*—Majestic, Parson, Siebert & Hsue

[57] ABSTRACT

A method of forming a molded plastic package having an integrated heat sink, without forming mold "flash" on an external surface of the integrated heat sink during the molding process, is described. The method generally follows conventional fabrication steps for molded plastic packages, except that a protective layer, preferably formed of a water or chemically soluble paste, or a high temperature adhesive tape, is applied to the external surface of the heat sink prior to the formation of the molded plastic package. The protective layer prevents mold "flash" from forming between the external surface of the heat sink and an inner surface of the mold during the molding process, and after formation of the molded plastic package, acts to protect the external surface of the heat sink from scratches and/or contaminants. The protective layer is readily removable by either dissolving it in water, in a chemical, or peeling it off, depending upon whether the protective layer is formed of a water soluble paste, a chemically soluble paste, or a high temperature adhesive tape, respectively.

23 Claims, 4 Drawing Sheets

METHOD OF FORMING MOLDED PLASTIC PACKAGES WITH INTEGRATED HEAT SINKS

BACKGROUND OF THE INVENTION

This invention relates in general to techniques for forming molded plastic packages with integrated heat sinks and in particular, to a technique for forming molded plastic packages with integrated heat sinks that prevents "flash" from forming on external surfaces of the heat sinks during the molding process.

Molded plastic packages with integrated heat sinks are disclosed, for example, in U.S. Pat. Nos. 3,930,114 and 5,041,902, both of which are incorporated herein by reference. An integrated heat sink (or heat spreader) is molded (i.e., integrated) in a molded plastic package for the purpose of dissipating heat away from an integrated circuit die encased in the plastic package. The integrated heat sink does this by having an internal surface thermally connected to the integrated circuit die and an external surface exposed through an exterior surface of the molded plastic package.

One problem encountered in the fabrication process for forming plastic packages with integrated heat sinks, is the problem of excess mold material or "flash" creeping around the heat sink during the molding process. Such "flash" can either entirely or partially cover the external surface of the heat sink which is to be exposed through the exterior surface of the molded plastic package.

Conventional techniques attempt to prevent formation of such mold "flash" by causing, through various means, the external surface of the heat sink to be pushed up against an internal surface of the mold. Such conventional techniques, however, are not always successful. One reason, for example, is because one of the pushed together surfaces, i.e., that of the heat sink or the mold, may not be planar, thus allowing mold "flash" to creep in and subsequently, solidify between the two surfaces. Such nonplanar surfaces become increasingly more likely as package dimensions increase, and the size of the heat sinks integrated in those packages increase accordingly.

Since the presence of such mold "flash" inhibits the desired heat transfer from the integrated circuit die to the exterior of the molded plastic package, it is desirable to remove it. Removal of such mold "flash," however, can be time-consuming and difficult, requiring an additional fabrication step after the molded package is released from the mold.

For example, mechanical "deflashing" techniques remove such mold "flash" by grinding it away (along with portions of the exterior surface of the molded plastic package through which the external surface of the heat sink is to be exposed), and chemical "deflashing" techniques remove such mold "flash" by dissolving it away (along with portions of the exterior surface of the molded plastic package), e.g., by immersing the molded plastic package in a nitride acid. One such mechanical "deflashing" technique is to blast the exterior surface of the molded plastic package with a fine sand or ceramic powder, and one such chemical "deflashing" technique is to immerse the molded plastic package in a bath of nitride solution. Such mechanical and chemical "deflashing" techniques, however, are both time consuming and expensive, because they require additional equipment, fixtures, and chemicals.

OBJECTS AND SUMMARY OF THE INVENTION

Accordingly, one object of the present invention is to develop a technique of forming a molded plastic package with an integrated heat sink (or heat spreader) that prevents mold "flash" from forming on an external surface of the integrated heat sink during the molding process so that a time consuming and expensive "deflashing" step in the fabrication process can be eliminated.

Another object of the present invention is to develop a technique of forming a molded plastic package with an integrated heat sink (or heat spreader) that protects the external surface of the heat sink from scratches and/or contamination during the fabrication process, and/or during storage or shipment of the finished product.

These and additional objects are accomplished by the various aspects of the present invention, wherein briefly stated, one aspect of the present invention accomplishes these objects by a method comprising the steps of: (1) applying a protective layer capable of withstanding a predetermined temperature to an external surface of a heat spreader (or heat sink); (2) inserting at least one integrated circuit die, the heat spreader, and a portion of a structure upon which the at least one integrated circuit die and the heat spreader are attached, into a mold in such a fashion that an exposed surface of the protective layer rests on and is level with a lower internal surface of the mold; (3) closing the mold so that a top portion of the mold engages the portion of the structure in such a fashion that the engagement causes the structure to be held in place; and (4) forming a molded plastic package by forcing a liquified plastic or epoxy resin into the mold, and thence, solidifying the plastic by baking it at the predetermined temperature.

The protective layer applied to the external surface of the heat spreader not only prevents mold "flash" from forming on the external surface of the heat spreader during the molding process, but also protects the external surface from scratches and/or contamination.

Preferably, the protective layer can be either a high temperature water or chemically soluble paste, or a high temperature tape. Since each of these types of protective layers is compressible, the protective layer also acts to alleviate the nonplanar surface problem previously described. For example, when pressure is applied to push an external surface of a metallic heat spreader against an internal surface of a rigid mold, the protective layer readily compresses at convex portions of the pushed against surfaces and acts to fill up any concave portions between the two surfaces.

Consequently, mold "flash" does not creep underneath the compressed protective layer as readily as it does underneath the external surface of a bare metallic heat spreader during the molding process. When removal of the protective layer is later desired, the protective layer of the water or chemically soluble paste can be easily dissolved in either water or a chemical as appropriate, or in the case of the high temperature tape, by either dissolving the adhesive on the tape or physically peeling the tape off.

Additional objects, features and advantages of the various aspects of the present invention will become apparent from the following description of its preferred embodiments, which description should be taken in conjunction with the accompanying drawings.

DETAILED DESCRIPTION OF THE PREFERRED EMBODIMENT

Figure 1A:
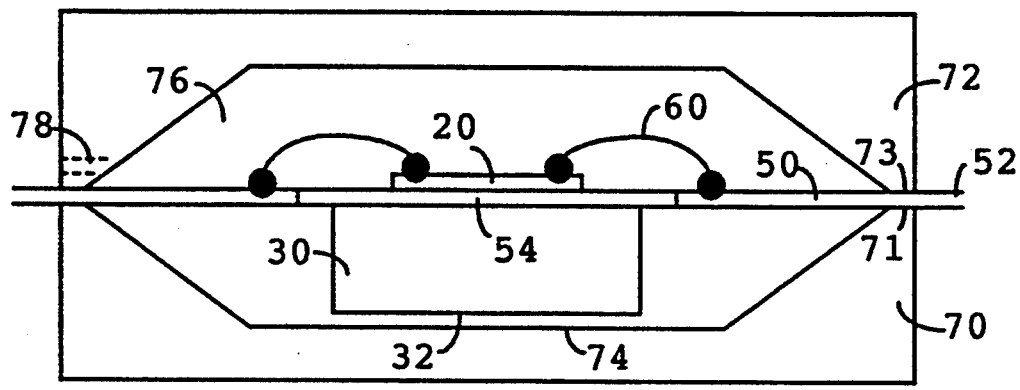
FIG. 1A illustrates, as a simplified example, a cross-sectional view of a conventional integrated circuit/lead frame/heat spreader structure positioned in a mold for injection molding of a plastic package.

FIG. 1A illustrates, as a simplified example, a cross-sectional view of a conventional integrated-circuit/-lead-frame/heat-spreader structure positioned in a mold, having an upper portion (or platen) 72 and a lower portion 70, for injection molding of a plastic package to encase the structure. The integrated-circuit/lead-frame/heat-spreader structure is conventionally formed prior to its insertion into the lower portion 70 of the mold, for example, by attaching an integrated circuit die 20 to one side of a die attach pad 54 of a lead frame 50 having a plurality of leads 52, and a heat spreader 30 to an opposite side of the die attach pad 54. After attachment of the integrated circuit die 20 to the die attach pad 54, bonding wires 60 are then bonded to bond pads formed on an active surface of the integrated circuit die 20 at one end and to corresponding ones of the plurality of leads 52 of the lead frame 50, at the other end.

The thus formed integrated-circuit/lead-frame/heat-spreader structure is then positioned into the lower portion 70 of the mold in such a fashion that an external surface 32 of the heat spreader 30 rests against an inner surface 74 of the lower portion 70 of the mold, and is held in that position by positioning the upper portion 72 against the lower portion 70, as shown in FIG. 1A. In particular, the upper portion 72 of the mold is fitted against the lower portion 70 of the mold such that respective edge lip portions, 73 and 71, are pressed together and against a dam bar section (not shown) of the lead frame 50, and distal ends (only partially shown) of the plurality of leads 52 extend out of the thus joined together upper and lower mold portions, 72 and 70, respectively.

A liquified plastic material (e.g., an epoxy resin) is then injected through a channel opening 78 into a cavity area 76 formed between the upper and lower portions, 72 and 70, respectively, of the mold, and kept in the cavity area 78 by the dam bar (not shown) of the lead frame 50, which prevents the injected plastic material from extruding out of the cavity area 76 through interstices formed between adjacent pairs of each of the plurality of leads 52 of the lead frame 50. The injected plastic material is then solidified in the cavity area 76 of the mold during a post bake period of approximately 6.0 hours at 175° C. at 1000 psi. Thereupon, after having solidified and taken on the shape of the cavity area 76 of the mold, the resulting molded plastic packaged part (e.g., 10 in FIG. 1B) is removed from the mold.

Figure 1B:
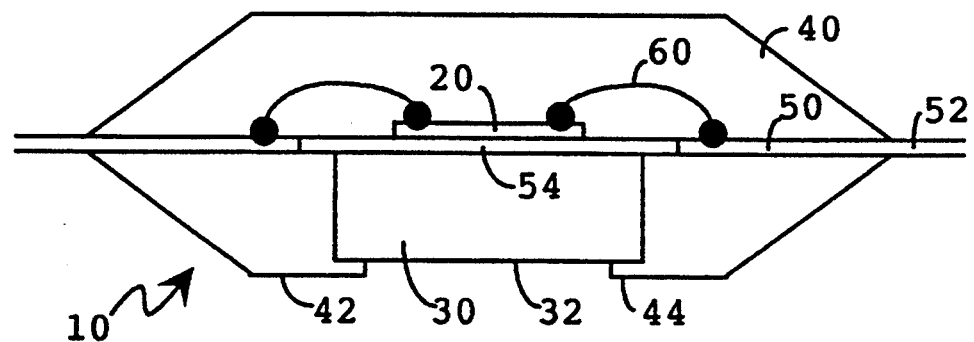
FIG. 1B illustrates, as a simplified example, a cross-sectional view of a conventional plastic package having an integrated heat sink connected to an integrated circuit die encased in the plastic package.

FIG. 1B illustrates, as an example, a cross-sectional view of a molded plastic packaged part 10 formed by the conventional molding process described in reference to FIG. 1A. The solidified plastic material 40 is shown to have formed a solid encasement, generally in the shape of the cavity area 76 of the mold, for the integrated-circuit/lead-frame/heat-spreader structure previously described in reference to FIG. 1A.

One problem with the conventional molding process described in reference to FIG. 1A, however, is that during the process, mold material may creep in between the external surface 32 of the heat spreader 30 and the inner surface 74 of the lower portion 70 of the mold, thus forming a mold "flash" area 44 that partially (or perhaps even entirely) covers the external surface 32 of the heat spreader 30.

Figure 1C:
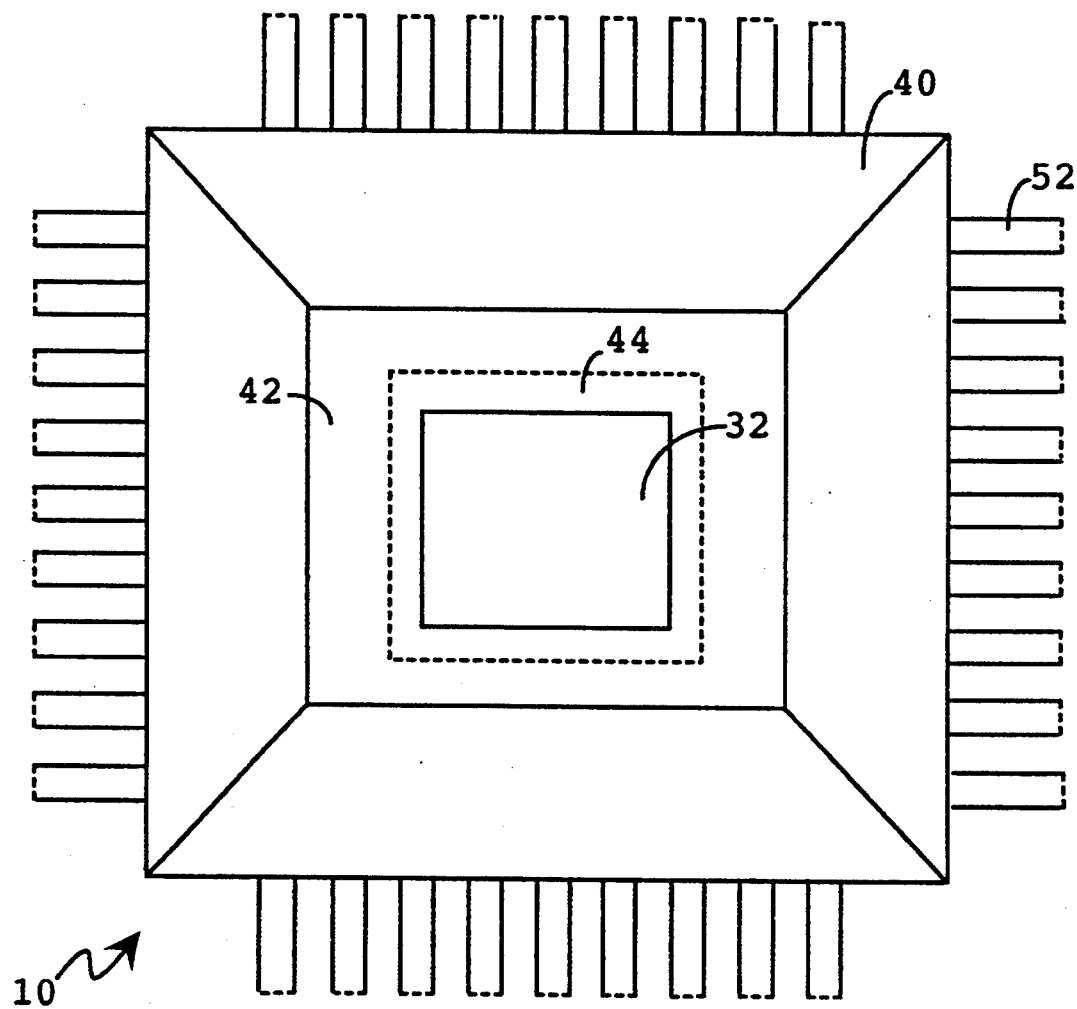
FIG. 1C illustrates, as an example, a bottom plan view of a conventional plastic package having an integrated heat sink exposed through an exterior surface of the molded plastic package.

FIG. 1C illustrates, as an example, a bottom plan view of the molded plastic packaged part 10 formed by the conventional molding process described in reference to FIG. 1A. In particular, the mold "flash" area 44 is shown to extend beyond the edges (dotted lines) of the heat spreader 30 to partially cover the bottom external surface 32 of the heat spreader 30 which lies exposed through an external surface 42 of the plastic mold 40 of the molded plastic packaged part 10. As previously described, it is highly desirable to remove such mold "flash" area 44 from the external surface 32 of the heat spreader 30 so that it will not inhibit the desired heat transfer from the integrated circuit die 20 encased in the molded plastic packaged part 10 to the exterior of the molded plastic packaged part 10.

To prevent such mold "flash" from forming on the external surface 32 of the heat spreader 30 during the molding process, a protective layer (e.g., 80 in FIG. 2A) formed of either a water or chemically soluble paste (e.g., the Vinex TM 2000 resin series from Air Products and Chemicals, Inc.), or a high temperature adhesive tape (e.g., LEAD/lock TM Semiconductor Packaging Tapes from Rogers Corporation), is first attached to the external surface 32 of the heat spreader 30 before the integrated-circuit/lead-frame/heat-spreader structure is inserted into the lower portion 70 of the mold.

Key characteristics required of the protective layer (e.g., 80 in FIG. 2A) is an ability to withstand, without significant deterioration, the high temperatures (e.g., 160° C. to 180° C.) that the layer will be exposed to during the molding process (e.g., post bake period), an ability to be compressed so that the protective layer (e.g., 80 in FIG. 2A) acts to fill any gaps between the external surface 32 of the heat spreader 30 and the inner surface 74 of the lower portion 74 of mold caused by non-planarity of either the external surface 32 of the heat spreader 30 or the inner surface 74 of the lower portion 70 of the mold, and an ability to be easily removed when removal of the protective layer (e.g., 80 in FIG. 2A) is desired.

If the protective layer (e.g., 80 in FIG. 2A) comprises a water or chemically soluble paste, it can be applied to the external surface 32 of the heat spreader 30, for example, by conventional screen printing techniques, either before or after individual heat spreaders (e.g., 30) are formed from a continuous sheet of metal. If the protective layer (e.g., 80 in FIG. 2A) comprises a high temperature adhesive tape, on the other hand, it can be either manually applied to individual heat spreaders (e.g., 30) or mechanically applied through conventional punch and transfer techniques (similar to cookie cutter techniques) that cut the tape into the right shapes and sizes by punching the tape, then place the thus cut and properly sized tape onto the external surface 32 of the heat spreader 30.

Figure 2A:
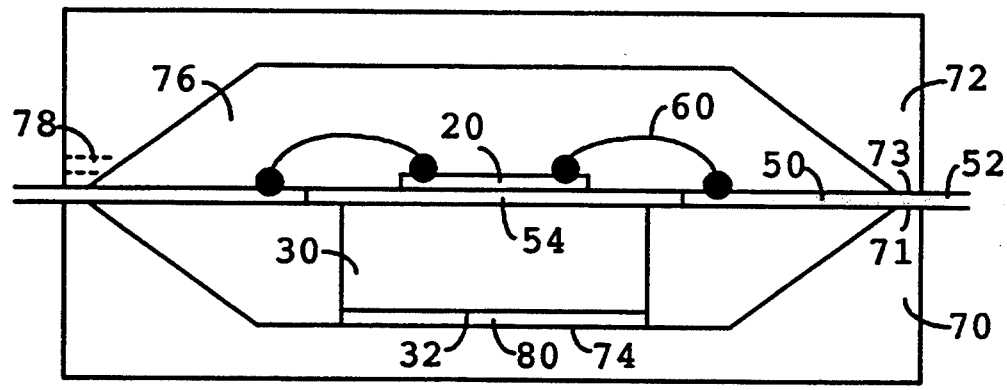
FIG. 2A illustrates, as an example, a cross-sectional view of an integrated circuit/lead frame/heat spreader structure, utilizing aspects of the present invention, positioned in a mold for injection molding of a plastic package.

FIG. 2A illustrates, as an example, a cross-sectional view of an integrated-circuit/lead-frame/heat-spreader structure, utilizing aspects of the present invention, positioned in a mold for injection molding of the plastic package. Formation of the integrated-circuit/lead-frame/heat-spreader structure is generally the same as previously described in reference to FIG. 1A, except that a protective layer 80 has been formed or attached to the external surface 32 of the heat spreader 30 prior to insertion of the structure into the lower portion 70 of the mold.

Thereupon, when the upper portion 72 of the mold is fitted against the lower portion 70 such that respective edge lip portions, 73 and 71, are pressed together and against a dam bar section (not shown) of the lead frame 50, the depth of the cavity in the lower portion 70 of the mold is typically designed such that the external surface 32 of the heat spreader 30 is pushed down towards the inner surface 74 of the lower portion 70 of the mold and the protective layer 80 is compressed there in-between the two surfaces, thereby inhibiting excess mold "flash" from creeping in and forming between the two surfaces.

Figure 2B:
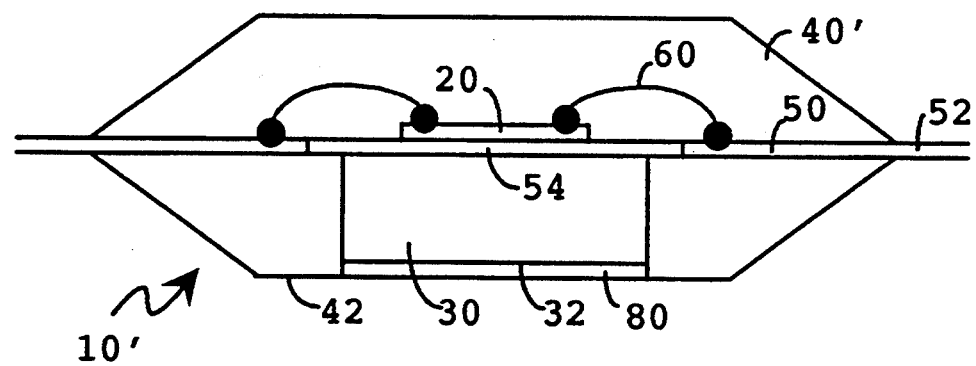
FIG. 2B illustrates, as an example, a cross-sectional view of a plastic package having an integrated heat sink, utilizing aspects of the present invention, connected to an integrated circuit die encased in the plastic package.
Figure 2C:
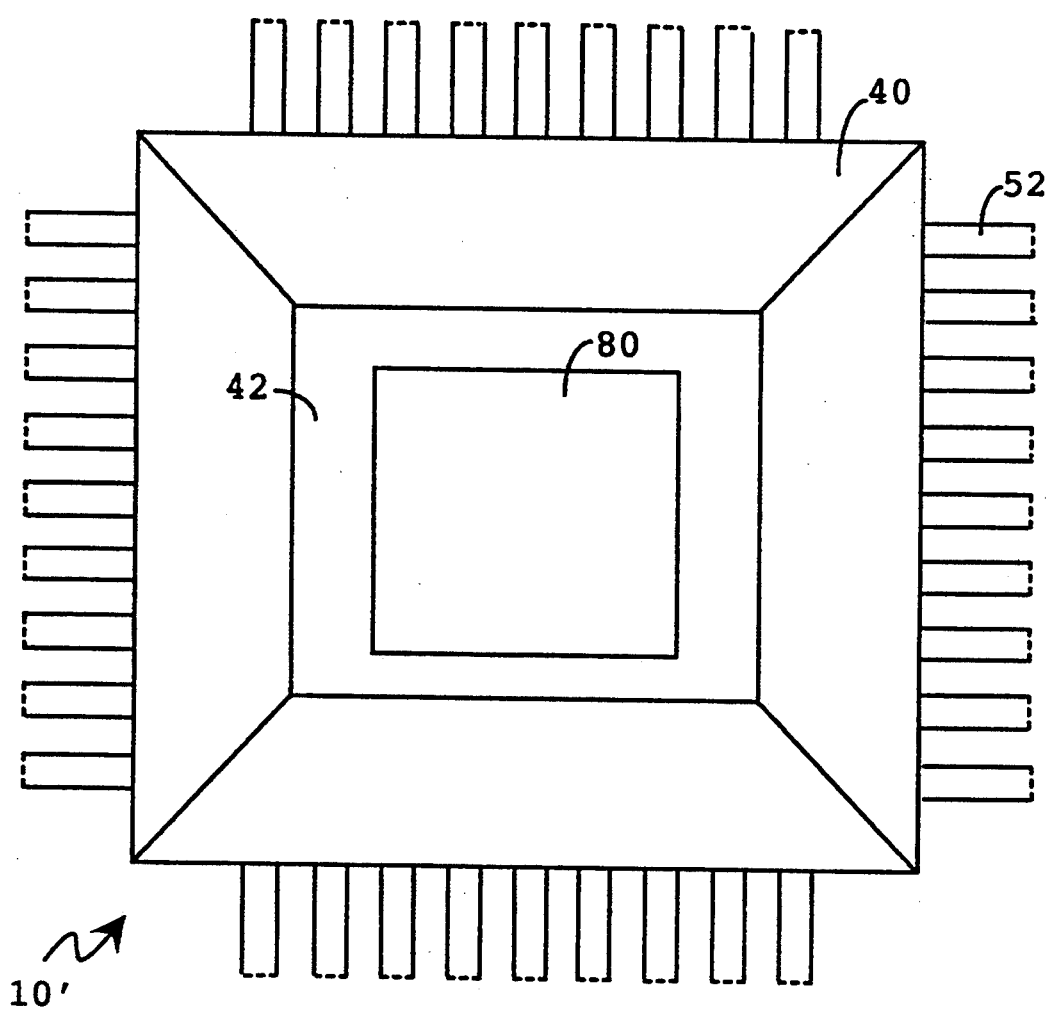
FIG. 2C illustrates, as an example, a bottom plan view of a plastic package having an integrated heat sink, utilizing aspects of the present invention, exposed through an exterior surface of the molded plastic package.

FIGS. 2B–2C illustrate, as examples, a cross-sectional and bottom plan view, respectively, of a molded plastic packaged part 10' formed by the molding process described in reference to FIG. 2A, utilizing aspects of the present invention. The solidified plastic material 40' is shown to have formed a solid encasement, generally in the shape of the cavity area 76 of the mold, for the integrated-circuit/lead-frame/heat-spreader structure previously described in reference to FIG. 2A, but without the formation of any (or significantly any) flash areas over the protective layer 80 which is shown to be exposed through the exterior surface 42 of the molded plastic packaged part 10'.

The protective layer 80 can subsequently be readily removed by either dissolving it in water, in the case of a protective layer 80 formed from a water soluble paste, by dissolving it in an appropriate chemical, in the case of a protective layer 80 formed from a chemically soluble paste, by dissolving an adhesive material holding the protective layer 80 to the external surface 32 of the heat spreader 30, in the case of a high temperature adhesive tape wherein the adhesive is chemically soluble, or by simply peeling off the protective layer 80, in the case of a high temperature adhesive tape. Until such protective layer 80 is removed, it acts to protect the external surface 32 of the heat spreader 30 against scratches and/or contaminants.

Although the various aspects of the present invention have been described with respect to preferred embodiments, it will be understood that the invention is entitled to full protection within the full scope of the appended claims.

What is claimed is:

1. A method of forming a molded plastic package encasing at least one integrated circuit die, a portion of a structure upon which said at least one integrated circuit die is attached, and a heat sink attached to said portion of said structure and thermally connected to said at least one integrated circuit die, wherein said heat sink includes a base portion having an external surface which is level with and exposed through one surface of said molded plastic package, said method comprising the steps of:

applying a protective layer capable of withstanding a selected temperature to said external surface of said heat sink;

inserting said at least one integrated circuit die, said portion of said structure, and said heat sink into a mold in such a fashion that an exposed surface of said protective layer rests on and is level with a lower internal surface of said mold;

closing said mold such that a top portion of said mold engages said portion of said structure in such a fashion that said engagement causes said structure to be held in place; and forming said molded plastic package by forcing a liquified plastic into said mold, and thence, solidifying said plastic by baking said plastic at said selected temperature.

2. The method as recited in claim 1, wherein said protective layer applying step comprises the step of applying a water soluble paste to said external surface of said heat sink.

3. The method as recited in claim 2, wherein said protective layer applying step comprises the step of applying a water soluble paste capable of withstanding at least 160° C. to said external surface of said heat sink.

4. The method as recited in claim 1, wherein said protective layer applying step comprises the step of applying a chemically soluble paste to said external surface of said heat sink.

5. The method as recited in claim 4, wherein said protective layer applying step comprises the step of applying a chemically soluble paste capable of withstanding a selected temperature of at least 160° C. to said external surface of said heat sink.

6. The method as recited in claim 1, wherein said protective layer applying step comprises the step of applying a high temperature tape to said external surface of said heat sink.

7. The method as recited in claim 6, wherein said protective layer applying step comprises the step of applying a high temperature tape capable of withstanding a selected temperature of at least 160° C. to said external surface of said heat sink.

8. The method as recited in claim 6, wherein said protective layer applying step comprises the step of applying a high temperature tape using an adhesive which is capable of withstanding a selected temperature and is chemically soluble, to said external surface of said heat sink.

9. The method as recited in claim 6, wherein said protective layer applying step comprises the step of applying a high temperature tape using an adhesive which is capable of withstanding a selected temperature and is water soluble, to said external surface of said heat sink.

10. The method as recited in claim 6, wherein said protective layer applying step comprises the step of applying a high temperature, polyimide film tape to said external surface of said heat sink.

11. The method as recited in claim 1, wherein said protective layer applying step comprises the step of applying a protective layer capable of withstanding a selected temperature to said external surface of said heat sink before said heat sink is attached to said portion of said structure.

12. The method as recited in claim 11, wherein said protective layer applying step comprises the step of screen-printing a protective layer capable of withstanding a selected temperature to said external surface of said heat sink before said heat sink is attached to said portion of said structure.

13. The method as recited in claim 11, wherein said protective layer applying step comprises the step of applying a water soluble paste capable of withstanding a selected temperature to said external surface of said heat sink before said heat sink is attached to said portion of said structure.

14. The method as recited in claim 11, wherein said protective layer applying step comprises the step of applying a water soluble paste capable of withstanding at least 160° C. to said external surface of said heat sink before said heat sink is attached to said portion of said structure.

15. The method as recited in claim 11, wherein said protective layer applying step comprises the step of screen-printing a water soluble paste to said external surface of said heat sink before said heat sink is attached to said portion of said structure.

16. The method as recited in claim 11, wherein said protective layer applying step comprises the step of applying a chemically soluble paste capable of withstanding a selected temperature to said external surface of said heat sink before said heat sink is attached to said portion of said structure.

17. The method as recited in claim 11, wherein said protective layer applying step comprises the step of applying a chemically soluble paste capable of withstanding at least 160° C. to said external surface of said heat sink before said heat sink is attached to said portion of said structure.

18. The method as recited in claim 11, wherein said protective layer applying step comprises the step of screen-printing a chemically soluble paste to said external surface of said heat sink before said heat sink is attached to said portion of said structure.

19. The method as recited in claim 1, further comprising, after said molded plastic package forming step, the step of removing said protective layer from said external surface of said heat sink.

20. The method as recited in claim 19, wherein said protective layer applying step comprises the step of applying a water soluble paste capable of withstanding a selected temperature to said external surface of said heat sink, and said protective layer removing step comprises the step of exposing said water soluble paste to water until said water soluble paste dissolves.

21. The method as recited in claim 19, wherein said protective layer applying step comprises the step of applying a chemically soluble paste capable of withstanding a selected temperature to said external surface of said heat sink, and said protective layer removing step comprises the step of exposing said chemically soluble paste to a chemical which dissolves said chemically soluble paste.

22. The method as recited in claim 19, wherein said protective layer applying step comprises the step of applying a high temperature tape using an adhesive which is capable of withstanding a selected temperature and is water soluble, to said external surface of said heat sink, and said protective layer removing step comprises the steps of exposing said water soluble adhesive to water until said water soluble adhesive dissolves, and thence, removing said tape from said external surface of said heat sink.

23. The method as recited in claim 19, wherein said protective layer applying step comprises the step of applying a high temperature tape using an adhesive which is capable of withstanding a selected temperature and is chemically soluble, to said external surface of said heat sink, and said protective layer removing step comprises the steps of exposing said chemically soluble adhesive to a chemical which dissolves said chemically soluble adhesive, and thence, removing said tape from said external surface of said heat sink.

* * * * *